(12) United States Patent
Sekine et al.

(10) Patent No.: US 8,604,536 B2
(45) Date of Patent: Dec. 10, 2013

(54) SEMICONDUCTOR DEVICE AND METHOD OF MANUFACTURING THE SAME

(75) Inventors: Katsuyuki Sekine, Yokohama (JP); Yoshio Ozawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 767 days.

(21) Appl. No.: 12/406,841

(22) Filed: Mar. 18, 2009

(65) Prior Publication Data

US 2009/0261403 A1 Oct. 22, 2009

(30) Foreign Application Priority Data

Apr. 17, 2008 (JP) ................................. 2008-108049

(51) Int. Cl.
*H01L 29/792* (2006.01)

(52) U.S. Cl.
USPC ...................... 257/324; 257/411; 257/E21.69

(58) Field of Classification Search
USPC ......... 257/314–324, E21.69, E27.103, E29.3, 257/390, 411; 438/261, 216, 591, 593; 365/185.17, 185.33
See application file for complete search history.

(56) References Cited

U.S. PATENT DOCUMENTS

| | | | |
|---|---|---|---|
| 6,411,548 B1 | 6/2002 | Sakui et al. | |
| 6,734,065 B2 | 5/2004 | Yim et al. | |
| 6,894,341 B2* | 5/2005 | Sugimae et al. | 257/315 |
| 6,906,390 B2* | 6/2005 | Nomoto et al. | 257/406 |
| 6,911,707 B2* | 6/2005 | Gardner et al. | 257/410 |
| 6,917,072 B2* | 7/2005 | Noguchi et al. | 257/324 |
| 7,851,296 B2* | 12/2010 | Noda et al. | 438/216 |
| 2002/0149081 A1* | 10/2002 | Goda et al. | 257/510 |
| 2004/0238878 A1* | 12/2004 | Sato et al. | 257/315 |
| 2005/0179095 A1* | 8/2005 | Hsu et al. | 257/390 |
| 2008/0073724 A1* | 3/2008 | Liang et al. | 257/369 |

FOREIGN PATENT DOCUMENTS

| | | |
|---|---|---|
| JP | 2004-158810 | 6/2004 |
| JP | 2009-252875 | 10/2009 |

OTHER PUBLICATIONS

First Office Action issued by the Japanese Patent Office on Oct. 23, 2012, for Japanese Patent Application No. 2008-108049, and English-language translation thereof.

* cited by examiner

*Primary Examiner* — Cuong Q Nguyen
*Assistant Examiner* — Yosef Gebreyesus
(74) *Attorney, Agent, or Firm* — Finnegan, Henderson, Farabow, Garrett & Dunner, LLP

(57) ABSTRACT

A semiconductor device includes a memory cell transistor including a first lower insulating film provided on a semiconductor substrate, a first intermediate insulating film provided on the first lower insulating film, a first upper insulating film provided on the first intermediate insulating film, and a first gate electrode provided on the first upper insulating film, and a select transistor including a second lower insulating film provided on the semiconductor substrate, a second intermediate insulating film provided on the second lower insulating film, a second upper insulating film provided on the second intermediate insulating film, and a second gate electrode provided on the second upper insulating film, wherein trap density of the second intermediate insulating film is lower than that of the first intermediate insulating film.

4 Claims, 7 Drawing Sheets

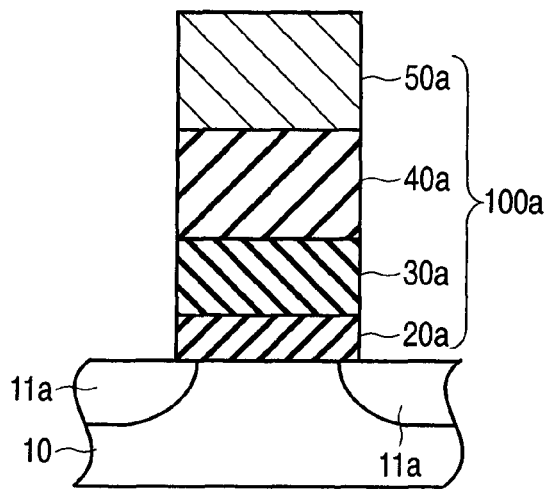
F I G. 1A
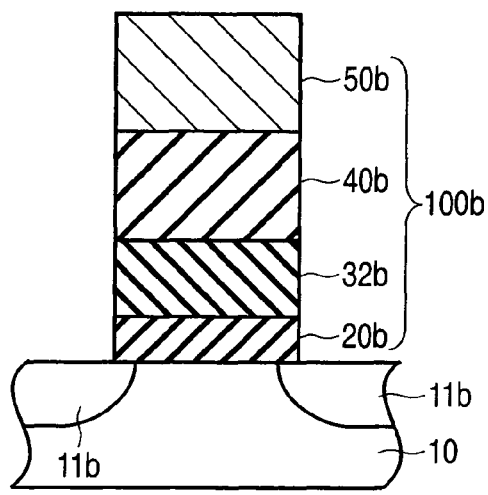
F I G. 1B
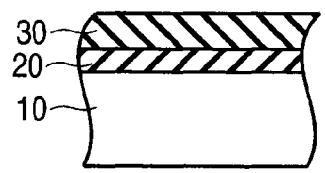
F I G. 2A
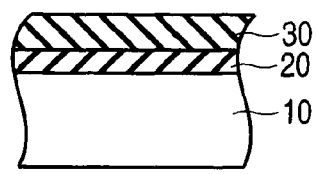
F I G. 2B
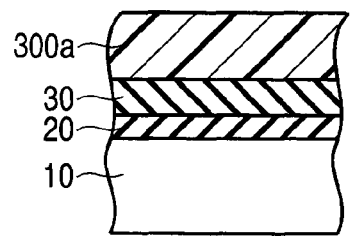
F I G. 3A
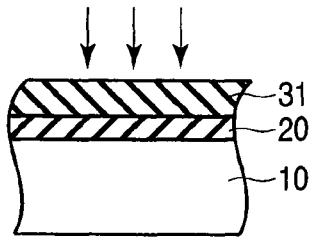
F I G. 3B

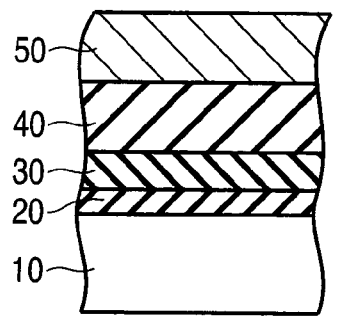 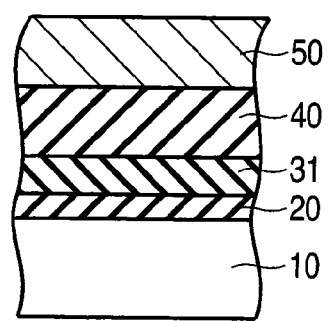
F I G. 7A  F I G. 7B
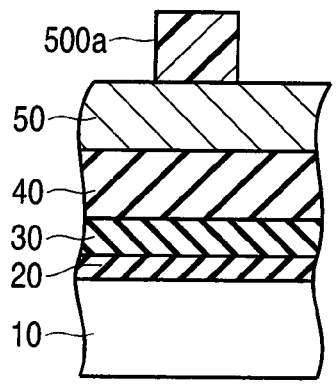 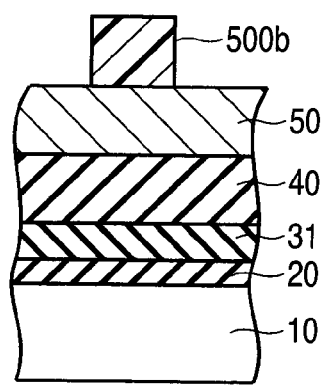
F I G. 8A  F I G. 8B
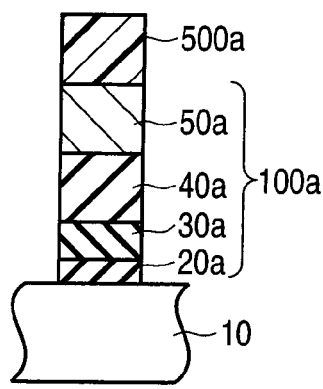 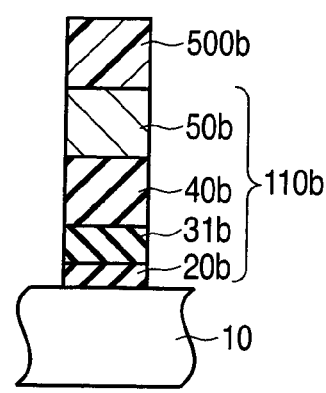
F I G. 9A  F I G. 9B

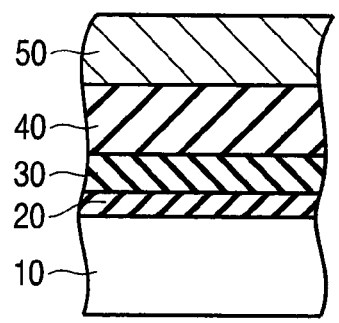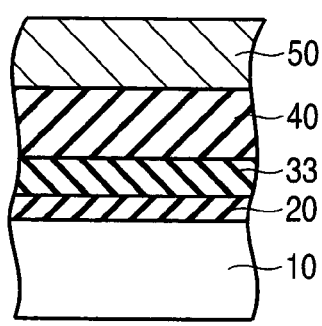
F I G. 13A    F I G. 13B
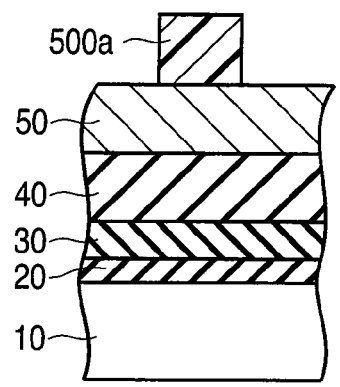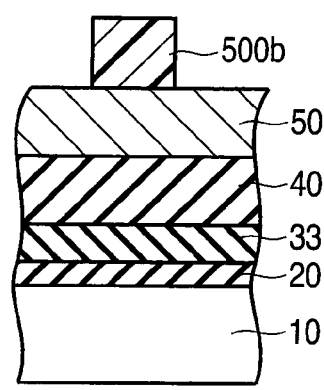
F I G. 14A    F I G. 14B
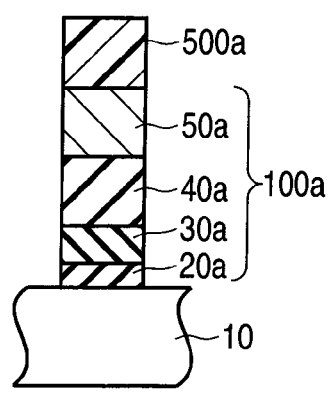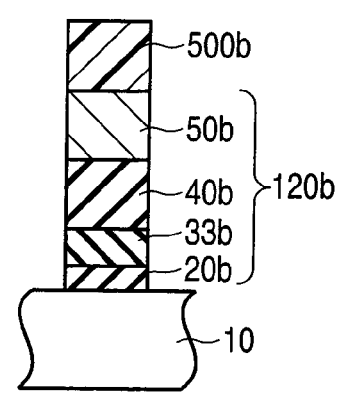
F I G. 15A    F I G. 15B

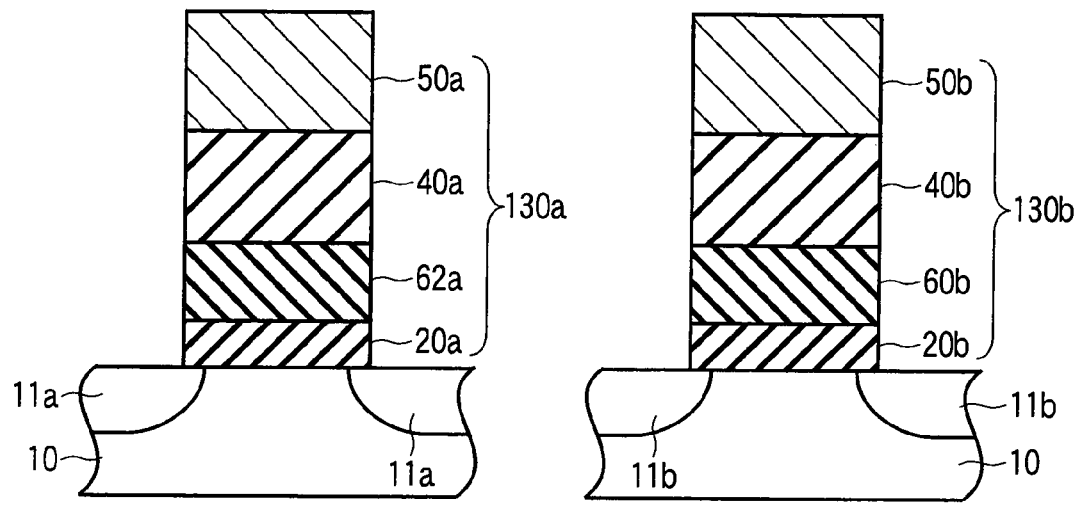
FIG. 16A    FIG. 16B
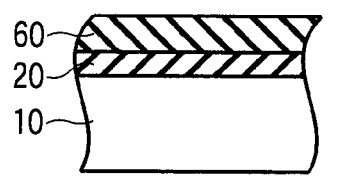   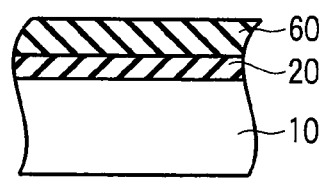
FIG. 17A    FIG. 17B
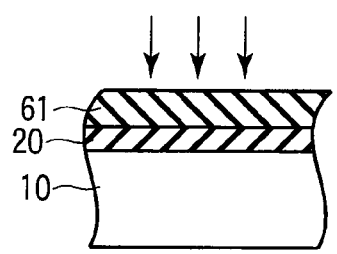   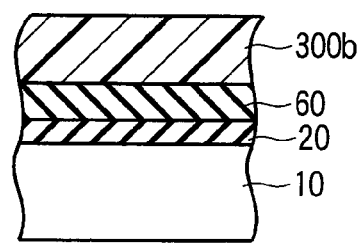
FIG. 18A    FIG. 18B

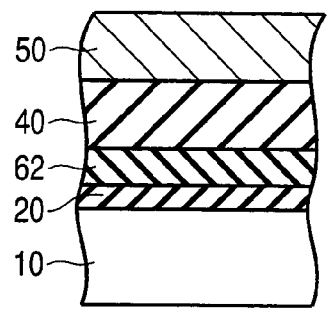 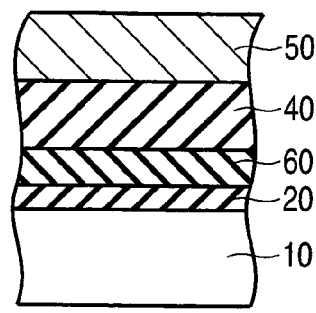
F I G. 19A    F I G. 19B
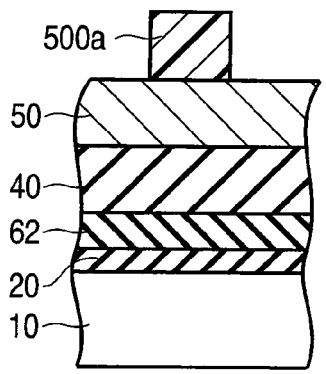 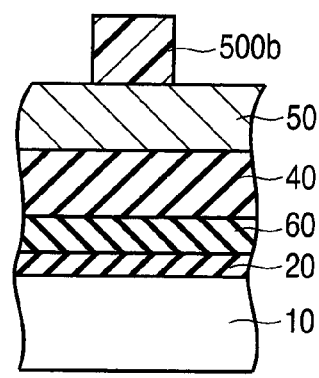
F I G. 20A    F I G. 20B
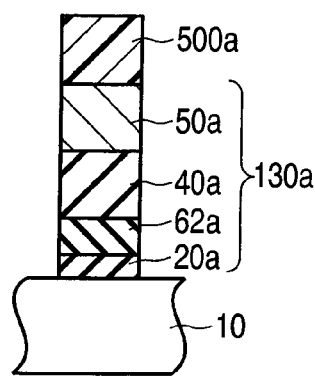 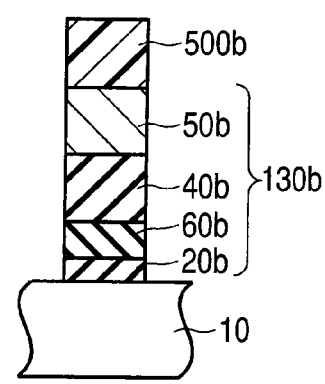
F I G. 21A    F I G. 21B

SEMICONDUCTOR DEVICE AND METHOD OF MANUFACTURING THE SAME

CROSS-REFERENCE TO RELATED APPLICATIONS

This application is based upon and claims the benefit of priority from prior Japanese Patent Application No. 2008-108049, filed Apr. 17, 2008, the entire contents of which are incorporated herein by reference.

BACKGROUND OF THE INVENTION

1. Field of the Invention

The present invention relates to a semiconductor device and a method of manufacturing the semiconductor device.

2. Description of the Related Art

Charge-trapping nonvolatile semiconductor memory devices are being developed which uses a charge trapping charge storage insulating film as a charge storage layer (see Jpn. Pat. Appln. KOKAI Publication No. 2004-158810). In the charge-trapping nonvolatile semiconductor memory device, charges injected into the charge storage insulating film through a tunnel insulating film are trapped at a trap level in the charge storage insulating film. The charges are thus stored in the charge storage insulating film. As a typical charge-trapping nonvolatile semiconductor memory device, a MONOS or SONOS nonvolatile semiconductor storage device is known. A silicon nitride film or the like is used as a material for the charge storage insulating film.

However, for the conventional charge-trapping nonvolatile semiconductor memory devices, both memory cell transistors and select transistors have been insufficiently examined.

Thus, it is conventionally difficult to obtain an excellent semiconductor device in which both the memory cell transistors and the select transistors exhibit proper characteristics.

BRIEF SUMMARY OF THE INVENTION

According to a first aspect of the present invention, there is provided a semiconductor device comprising: a memory cell transistor including a first lower insulating film provided on a semiconductor substrate, a first intermediate insulating film provided on the first lower insulating film, a first upper insulating film provided on the first intermediate insulating film, and a first gate electrode provided on the first upper insulating film; and a select transistor including a second lower insulating film provided on the semiconductor substrate and formed of the same insulating material film as that of the first lower insulating film, a second intermediate insulating film provided on the second lower insulating film, a second upper insulating film provided on the second intermediate insulating film and formed of the same insulating material film as that of the first upper insulating film, and a second gate electrode provided on the second upper insulating film and formed of the same conductive material film as that of the first gate electrode, wherein trap density of the second intermediate insulating film is lower than that of the first intermediate insulating film.

According to a second aspect of the present invention, there is provided a semiconductor device comprising: a memory cell transistor including a first lower insulating film provided on a semiconductor substrate, a first intermediate insulating film provided on the first lower insulating film, a first upper insulating film provided on the first intermediate insulating film, and a first gate electrode provided on the first upper insulating film; and a select transistor including a second lower insulating film provided on the semiconductor substrate and formed of the same insulating material film as that of the first lower insulating film, a second intermediate insulating film provided on the second lower insulating film, a second upper insulating film provided on the second intermediate insulating film and formed of the same insulating material film as that of the first upper insulating film, and a second gate electrode provided on the second upper insulating film and formed of the same conductive material film as that of the first gate electrode, wherein oxygen concentration of the second intermediate insulating film is higher than that of the first intermediate insulating film.

According to a third aspect of the present invention, there is provided a semiconductor device comprising: a memory cell transistor including a first lower insulating film provided on a semiconductor substrate, a first intermediate insulating film provided on the first lower insulating film, a first upper insulating film provided on the first intermediate insulating film, and a first gate electrode provided on the first upper insulating film; and a select transistor including a second lower insulating film provided on the semiconductor substrate and formed of the same insulating material film as that of the first lower insulating film, a second intermediate insulating film provided on the second lower insulating film, a second upper insulating film provided on the second intermediate insulating film and formed of the same insulating material film as that of the first upper insulating film, and a second gate electrode provided on the second upper insulating film and formed of the same conductive material film as that of the first gate electrode, wherein fluorine concentration of the second intermediate insulating film is higher than that of the first intermediate insulating film.

According to a fourth aspect of the present invention, there is provided a method of manufacturing a semiconductor device comprising a memory cell transistor and a select transistor, the method comprising: forming a lower insulating film on a semiconductor substrate; forming an intermediate insulating film on the lower insulating film; forming an upper insulating film on the intermediate insulating film; forming a gate electrode film on the upper insulating film; and patterning the lower insulating film, the intermediate insulating film, the upper insulating film, and the gate electrode film to form a gate structure of the memory cell transistor and a gate structure of the select transistor, wherein an oxidation treatment is performed on the intermediate insulating film formed in a select transistor formation region.

According to a fifth aspect of the present invention, there is provided a method of manufacturing a semiconductor device comprising a memory cell transistor and a select transistor, the method comprising: forming a lower insulating film on a semiconductor substrate; forming an intermediate insulating film on the lower insulating film; forming an upper insulating film on the intermediate insulating film; forming a gate electrode film on the upper insulating film; and patterning the lower insulating film, the intermediate insulating film, the upper insulating film, and the gate electrode film to form a gate structure of the memory cell transistor and a gate structure of the select transistor, wherein a defect formation treatment is performed on the intermediate insulating film formed in a memory cell transistor formation region.

BRIEF DESCRIPTION OF THE SEVERAL VIEWS OF THE DRAWING

FIGS. 1A and 1B are sectional views schematically showing a configuration of a semiconductor device according to a first embodiment of the present invention;

FIGS. 2A and 2B are sectional views schematically showing a part of a process of manufacturing a semiconductor device according to the first embodiment of the present invention;

FIGS. 3A and 3B are sectional views schematically showing a part of the process of manufacturing the semiconductor device according to the first embodiment of the present invention;

FIGS. 7A and 7B are sectional views schematically showing a part of a process of manufacturing a semiconductor device according to a first modification of the first embodiment of the present invention;

FIGS. 8A and 8B are sectional views schematically showing a part of the process of manufacturing the semiconductor device according to the first modification of the first embodiment of the present invention;

FIGS. 9A and 9B are sectional views schematically showing a part of the process of manufacturing the semiconductor device according to the first modification of the first embodiment of the present invention;

FIGS. 13A and 13B are sectional views schematically showing a part of the process of manufacturing the semiconductor device according to the second embodiment of the present invention;

FIGS. 14A and 14B are sectional views schematically showing a part of the process of manufacturing the semiconductor device according to the second embodiment of the present invention;

FIGS. 15A and 15B are sectional views schematically showing a part of the process of manufacturing the semiconductor device according to the second embodiment of the present invention;

FIGS. 16A and 16B are sectional views schematically showing a configuration of a semiconductor device according to a third embodiment of the present invention;

FIGS. 17A and 17B are sectional views schematically showing a part of a process of manufacturing a semiconductor device according to the third embodiment of the present invention;

FIGS. 18A and 18B are sectional views schematically showing a part of the process of manufacturing the semiconductor device according to the third embodiment of the present invention;

FIGS. 19A and 19B are sectional views schematically showing a part of the process of manufacturing the semiconductor device according to the third embodiment of the present invention;

FIGS. 20A and 20B are sectional views schematically showing a part of the process of manufacturing the semiconductor device according to the third embodiment of the present invention; and FIGS. 21A and 21B are sectional views schematically showing a part of the process of manufacturing the semiconductor device according to the third embodiment of the present invention.

DETAILED DESCRIPTION OF THE INVENTION

Figure 4A:
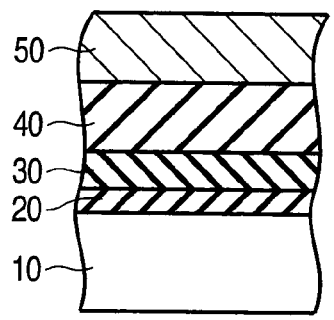
FIGS. 4A and 4B are sectional views schematically showing a part of the process of manufacturing the semiconductor device according to the first embodiment of the present invention.

First, before description of the embodiments, problems that may occur when both memory cell transistors and select transistors are formed will be described.

As a method of manufacturing a charge-trapping nonvolatile semiconductor memory device, a method is possible in which the memory cell transistors and select transistors are simultaneously formed during a single step. However, when an insulating film with a high trap level density is formed so as to store charges in a charge storage layer of each of the memory cell transistors, the insulating film with the high trap level density is also formed in a select transistor formation region. Thus, charges are stored in each of the select transistors. Consequently, a threshold value for the select transistor varies depending on a period over which the transistor is used. Finally, the select transistor may disadvantageously be prevented from functioning properly. Furthermore, if an insulating film with a low trap level density is formed in order to prevent charges from being stored in the select transistor, no charge is stored in the memory cell transistor. As a result, a data write operation may disadvantageously be prevented from being accurately performed.

To solve this problem, a method may be used which forms the memory cell transistors separately from the select transistors by etching away the insulating film formed as the charge storage layer only from the select transistor formation region. However, this method may disadvantageously increase the number of process steps required. Moreover, the height of a gate structure varies between the memory cell transistor and the select transistor. Thus, etching during formation of the gate structure may etch portions of a semiconductor substrate each of which is close to the periphery of the corresponding select transistor. Consequently, portions of a surface region of the semiconductor substrate each of which is located around the periphery of the corresponding select transistor are recessed. As a result, the characteristics of the select transistor may disadvantageously be degraded by a short channel effect.

Embodiments of the present invention (charge-trapping nonvolatile semiconductor memory devices using a charge storage insulating film as a charge storage layer) will be described with reference to the drawings. All the figures are sectional views taken along a bit line direction (channel length direction). In the figures, reference character A denotes a memory cell transistor formation region. Reference character B denotes a select transistor formation region.

First Embodiment

FIGS. 1A and 1B schematically show a configuration of a semiconductor device according to a first embodiment of the present invention.

As shown in FIGS. 1A and 1B, an element region having a source and drain regions 11a and 11b are formed in a semiconductor substrate 10 (silicon substrate).

As shown in FIG. 1A, a memory cell transistor 100a is provided in the memory cell transistor formation region. The memory cell transistor 100a has a tunnel insulating film (first lower insulating film) 20a, a charge storage insulating film (first intermediate insulating film) 30a formed on the tunnel insulating film 20a, a block insulating film (first upper insulating film) 40a provided on the charge storage insulating film 30a, and a control gate electrode (first gate electrode) 50a provided on the block insulating film 40a.

As shown in FIG. 1B, a select transistor 100b is provided in the select transistor formation region. The select transistor 100b has a insulating film (second lower insulating film) 20b formed of the same insulating material film as that of the tunnel insulating film 20a, an insulating film (second intermediate insulating film) 32b provided on the insulating film 20b, an insulating film (second upper insulating film) 40b provided on the insulating film 32b and formed of the same insulating material film as that of the block insulating film 40a, and a gate electrode (second gate electrode) 50b provided on the insulating film 40b and formed of the same conductive material film as that of the control gate electrode 50a.

The charge storage insulating film 30a is formed of an insulating film containing silicon nitride offering a high trap level density, as a main component. On the other hand, the insulating film 32b is formed of an insulating film containing silicon oxynitride as a main component. Furthermore, the insulating film 32b has a higher oxygen concentration than the charge storage insulating film 30a. Thus, the insulating film 32b has a trap level reduced by oxygen bonding. Thus, the insulating film 32b has a lower trap level density than the charge storage insulating film 30a. Consequently, charges can be prevented from being stored in the insulating film 32b.

In the above-described charge-trapping nonvolatile semiconductor memory device, an appropriate voltage is applied to the control gate electrode 50a of the memory cell transistor 100a and the semiconductor substrate 10 to effect charging between the semiconductor substrate 10 and the charge storage insulating film 30a via the tunnel insulating film 20a. Specifically, charges injected into the charge storage insulating film 30a through the tunnel insulating film 20a are trapped at the trap level of the charge storage insulating film 30a. Thus, charges are stored in the charge storage insulating film 30a.

In the actual nonvolatile semiconductor memory device, a plurality of memory cell transistors are arranged in a word line direction and in a bit line direction. A typical example of the above-described nonvolatile semiconductor memory device is a NAND nonvolatile memory including a plurality of memory cell transistors connected in series and provided between select transistors.

In the present embodiment, the intermediate insulating film 32b, provided in the select transistor 100b, has a higher oxygen concentration than the intermediate insulating film (charge storage insulating film) 30a, provided in the memory cell transistor 100a. Thus, since the oxygen bonding reduces the trap level density, the insulating film 32b exhibits a lower trap level density than the charge storage insulating film 30a. This prevents charges from being trapped in the insulating film 32b when a voltage is applied to the select transistor 100b. That is, a possible variation in the threshold value for the select transistor 100b caused by the charge trapping in the insulating film 32b can be inhibited. As a result, the select transistor 100b is prevented from malfunctioning, allowing stable select transistor characteristics to be obtained. On the other hand, since the charge storage insulating film 30a with the high trap level density is formed in the memory cell transistor 100a, charges can be reliably stored in the memory cell transistor. Thus, the present embodiment provides a nonvolatile semiconductor memory device with excellent characteristics and high reliability.

Now, a method of manufacturing a semiconductor device according to the present embodiment will be described with reference to FIGS. 2A, 2B, 3A, 3B, 4A, 4B, 5A, and 5B.

First, as shown in FIGS. 2A and 2B, a silicon oxide film of thickness 2 to 6 nm is formed, by a thermal oxidation method, on the semiconductor substrate 10 as a lower insulating film 20 for the tunnel insulating film. Thereafter, the resulting surface is exposed to an NO atmosphere at 700 to 900 degrees to introduce nitrogen into the silicon oxide film. This further improves the stress resistance of the tunnel insulating film 20. Subsequently, in a dichlorosilane (DCS [$SiH_2Cl_2$]) and $NH_3$ atmosphere, a silicon nitride film with a thickness of 5 to 10 nm and a high trap level density is deposited on the lower insulating film 20 as an intermediate insulating film 30 for the charge storage insulating film, using a low-pressure chemical vapor deposition (LPCVD) method.

Although the silicon nitride film is used as the intermediate insulating layer, a silicon oxynitride film may be used instead provided that the silicon oxynitride film does not reduce the trap level density.

Then, as shown in FIGS. 3A and 3B, a photoresist is coated all over the resulting surface. The photoresist coated in the select transistor formation region is then removed using a lithography process. An element (oxidation promoter) such as boron or fluorine which increases the oxidation rate of the silicon nitride film is introduced using, for example, a plasma doping method. As shown in FIG. 3A, the memory cell transistor formation region is masked by a photoresist film 300a. As shown in FIG. 3B, the photoresist is removed from the select transistor formation region. Thus, the oxidation promoter is introduced into the intermediate insulating film 30 in the select transistor formation region (oxidation promotion treatment). As a result, the intermediate insulating film 30 in the select transistor formation region becomes an intermediate insulating film 31 that is readily oxidized.

Alternatively, to increase the oxidation rate of the silicon nitride film (intermediate insulating film), a method of ion-implanting a rare gas element such as argon or xenon, or silicon, nitrogen, oxygen, or the like may be used. That is, the ion implantation is used to introduce damage into the bond between silicon and nitrogen (Si—N bond) in the silicon nitride film. Thus forming a defect in the silicon nitride allows the Si—N bond to be easily cut, enabling an increase in the oxidation rate of the silicon nitride film. Furthermore, any element other than those described above can be introduced for an oxidation promotion treatment provided that the introduction is intended to increase the oxidation rate of the silicon nitride film.

Figure 4B:
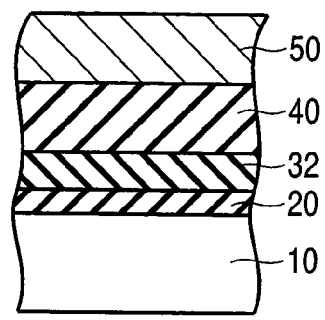

Then, as shown in FIGS. 4A and 4B, the photoresist film 300a is stripped. The surfaces of the intermediate insulating films 30 and 31 are thereafter exposed to an oxidizing atmosphere at 600 to 1,000 degrees for a thermal treatment (oxidation treatment). As a result, the intermediate insulating film 31 subjected to the oxidation promotion treatment is selectively oxidized and changed to a silicon oxynitride film 32, with the trap level density significantly reduced. Furthermore, for the intermediate insulating film 30, not subjected to the oxidation promotion treatment, the surface of the intermediate insulating film 30 is oxidized only by a thickness of about 1 nm. Thus, a possible decrease in the trap level density of the intermediate insulating film 30 is substantially prevented.

Oxygen ($O_2$) and steam ($H_2O$) are preferably used as oxidizers for the thermal treatment in the oxidizing atmosphere because these elements exhibit selectivity for the oxidation of the select transistor formation region and the memory cell transistor formation region. Oxidizers such as ozone ($O_3$) and oxygen radical (O*) offer strong oxidation power and thus exhibits low oxidation selectivity. As a result, these oxidizers may oxidize even the intermediate insulating film 30, not subjected to the oxidation promotion treatment.

Subsequently, a silicon oxide film of thickness about 6 to 15 nm is deposited all over the resulting surface as an upper insulating film 40 for the block insulating film, by means of the LPCVD method using DCS and $N_2O$. Then, a polysilicon film is then deposited on the upper insulating film 40 as a gate electrode film 50 by the LPCVD method. An alumina film ($Al_2O_3$) of thickness about 15 to 30 nm may be formed as the upper insulating film 40 by an atomic layer deposition (ALD) method using trimethyl aluminum (TMA) and $H_2O$. Alternatively, the gate electrode film 50 may be formed using a metal material.

Figure 5A:
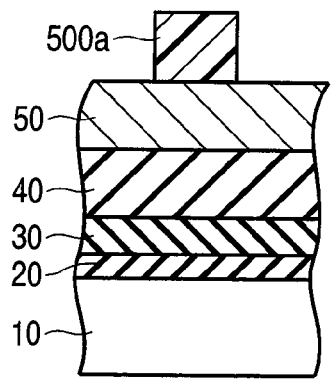
FIGS. 5A and 5B are sectional views schematically showing a part of the process of manufacturing the semiconductor device according to the first embodiment of the present invention.
Figure 5B:
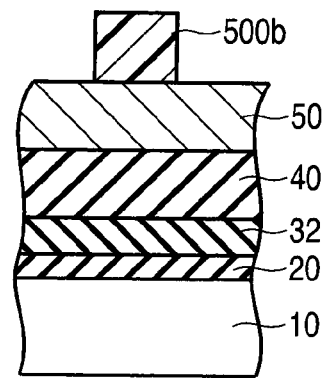

Then, as shown in FIGS. 5A and 5B, patterns of the photoresist films 500a and 500b are formed on the gate electrode film 50.

Figure 6A:
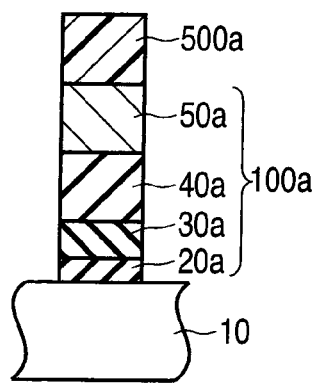
FIGS. 6A and 6B are sectional views schematically showing a part of the process of manufacturing the semiconductor device according to the first embodiment of the present invention.
Figure 6B:
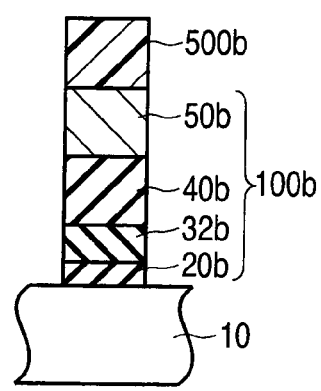

Now, the gate electrode film 50, upper insulating film 40, intermediate insulating films 30 and 32, and lower insulating film 20 are etched through photoresist films 500a and 500b as a mask by a reactive ion etching (RIE) method. As a result, as shown in FIG. 6A, the gate structure of the memory cell transistor 100a is formed which is made up of the tunnel insulating film 20a, charge storage insulating film 30a, block insulating film 40a, and control gate electrode 50a provided on the semiconductor substrate 10. Furthermore, as shown in FIG. 6B, the gate structure of the select transistor 100b is formed which is made up of the insulating film 20b, insulating film 32b, insulating film 40b, and gate electrode 50b provided on the semiconductor substrate 10. A stack of the insulating films 20b, 32b, and 40b makes up a gate insulating film of the select transistor.

Thereafter, an impurity element such as arsenic is ion implanted into the surface region of the semiconductor substrate 10, for example, through the photoresist films 500a and 500b, the gate electrodes 50a and 50b, and the like as a mask. The photoresist films 500a and 500b are thereafter stripped, and a thermal treatment is performed to form the source and drain regions 11a and 11b as shown in FIGS. 1A and 1B.

Thereafter, a nonvolatile semiconductor memory device is formed through well-known steps, that is, a step of forming an interlayer insulating film (not shown in the drawings) and a step of forming interconnects (not shown in the drawings) and the like.

According to the above-described embodiment, the photoresist 300a is formed on the intermediate insulating film 30. The intermediate insulating film 30 in the select transistor formation region is then subjected to the oxidation promotion treatment to form the intermediate insulating film 31 subjected to the oxidation promotion treatment. Then, the photoresist 300a is stripped, and the thermal treatment is performed in the oxidizing atmosphere. At this time, the intermediate insulating film 30 in the memory cell transistor formation region is not subjected to the oxidation promotion treatment and is thus not substantially oxidized. In contrast, the insulating film 31 in the select transistor formation region has been subjected to the oxidation promotion treatment and is thus selectively oxidized to form the oxidized insulating film 32. Thus, the insulating film 32 in the select transistor formation region has a higher oxygen concentration and a lower trap level density than the insulating film 30 in the memory cell transistor formation region. Consequently, possible charge trapping in the insulating film 32 can be prevented when a voltage is applied to the select transistor 100b. That is, a possible variation in the threshold value for the select transistor 100b caused by the charge trapping in the insulating film 32b can be inhibited. As a result, the select transistor 100b is prevented from malfunctioning, allowing stable select transistor characteristics to be obtained. Furthermore, the charge storage insulating film 30a, provided in the memory cell transistor 100a, offers the sufficient trap level density, allowing charges to be reliably stored in the memory cell transistor 100a. Consequently, the present embodiment provides a nonvolatile semiconductor memory device including memory cell transistors and select transistors and offering excellent characteristics and high reliability, without the need for a large number of process steps.

Furthermore, in the present embodiment, the intermediate insulating film in the select transistor formation region is selectively oxidized. The present embodiment thus provides a high-quality gate insulating film with a low trap level density without the need to remove the intermediate insulating film from the select transistor formation region. Consequently, in the present embodiment, the memory cell transistor and the select transistor can be set to the same height. This enables a possible situation to be avoided in which portions of the surface region of the semiconductor substrate each of which is close to the corresponding select transistor is etched and recessed.

(Modification 1)

Now, a modification of the first embodiment will be described with reference to FIGS. 7A, 7B, 8A, 8B, 9A, and 9B. A basic structure and a basic manufacturing method according to the first modification are similar to those of the first embodiment described above. Thus, the matters described above in the embodiment and matters easily conceivable from the above-described embodiment will not be described.

In the above-described embodiment, as shown in FIGS. 3A and 3B, the oxidation promoter was introduced into the intermediate insulating film 30 in the select transistor formation region to form the insulating film 31. Thereafter, in the step shown in FIGS. 4A and 4B, the insulating film 31 into which the oxidation promoter was introduced was selectively oxidized to form the insulating film 32. The present modification is different from the above-described embodiment in timing for the oxidation treatment.

In the present modification, after the step shown in FIGS. 3A and 3B, the upper insulating film 40 and the gate electrode film 50 are formed on the insulating film 31 without the need for the oxidation treatment as shown in FIGS. 7A and 7B. Thereafter, as shown in FIGS. 8A and 8B, patterns of the photoresists 500a and 500b are formed on the gate electrode film 50.

Then, the gate electrode film 50, upper insulating film 40, intermediate insulating films 30 and 31, and lower insulating film 20 are etched through the photoresist films 500a and 500b as a mask by the reactive ion etching (RIE) method. As a result, as shown in FIG. 9A, the gate structure of the memory cell transistor 100a is formed which is made up of the tunnel insulating film 20a, charge storage insulating film 30a, block insulating film 40a, and control gate electrode 50a provided on the semiconductor substrate 10. Furthermore, as shown in FIG. 9B, the gate structure of a select transistor 110b is formed which is made up of the insulating film 20b, insulating film 31b, insulating film 40b, and gate electrode 50b provided on the semiconductor substrate 10. A stack film of the insulating films 20b, 31b, and 40b makes up the gate insulating film of the select transistor.

Thereafter, an impurity element such as arsenic is ion implanted into the surface region of the semiconductor substrate 10 through the photoresist films 500a and 500b, the gate electrodes 50a and 50b, and the like as a mask. The photoresist films 500a and 500b are stripped, and the thermal treatment (oxidation treatment) is performed in an oxidizing atmosphere at 600 to 1,000 degrees. The entire insulating film 31b of the select transistor formation region is oxidized and changed to a silicon oxynitride film with a low charge trap level. On the other hand, the insulating film 30a of the memory cell transistor region is not subjected to the oxidation promotion treatment. Thus, only a side wall portion of the insulating film 30a is oxidized, with a possible decrease in the trap level density of the insulating film 30a substantially prevented.

As described above, in the present modification, as in the case of the above-described embodiment, the intermediate insulating film 30 in the select transistor formation region is selectively subjected to the oxidation promotion treatment. Thus, as is the case with the above-described embodiment, the memory cell transistor is provided with the charge storage insulating film with the high trap level density, allowing charges to be reliably stored in the memory cell transistor. Furthermore, the select transistor is provided with the excellent gate insulating film with the low trap level density. Therefore, the present modification provides a nonvolatile semiconductor memory device including memory cell transistors and select transistors and offering excellent characteristics and high reliability, without the need for a large number of process steps.

Furthermore, in the present modification, the thermal treatment in the oxidizing atmosphere is performed after the formation of the gate structures of the memory cell transistor 100a and select transistor 110b. The thermal treatment in the oxidizing atmosphere allows the side walls of the gate electrode to be simultaneously oxidized. Consequently, in the present modification, the same oxidation treatment can be used for both the side walls of the gate electrode and the intermediate insulating film of the select transistor formation region. Therefore, the manufacturing process can be simplified.

(Modification 2)

Figure 10A:
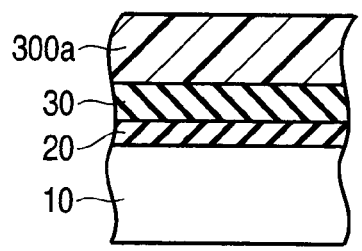
FIGS. 10A and 10B are sectional views schematically showing a part of a process of manufacturing a semiconductor device according to a second modification of the first embodiment of the present invention.
Figure 10B:
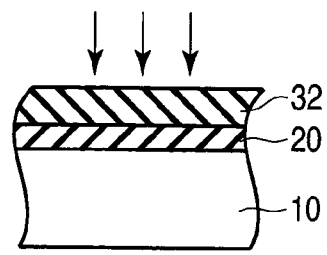

Now, a second modification of the first embodiment will be described with reference to FIGS. 10A and 10B. A basic structure and a basic manufacturing method according to the second modification are similar to those of the first embodiment described above. Thus, the matters described above in the embodiment and matters easily conceivable from the above-described embodiment will not be described.

In the present modification, in the step shown in FIGS. 3A and 3B, the photoresist film 300a is formed. Then, as shown in FIGS. 10A and 10B, an oxygen plasma treatment is performed at low temperatures of 100 to 200 degrees, to selectively plasma-oxidize and convert the intermediate insulating film 30 in the select transistor formation region, into the insulating film 32 with a low trap level density. As is the case with the first embodiment, before the oxidation treatment, the element (oxidation promoter) such as boron or fluorine which increases the oxidation rate of the silicon nitride film may be introduced. Alternatively, the rare gas element such as argon or xenon, or silicon, nitrogen, oxygen, or the like may be pre-ion-implanted to introduce such damage as promotes oxidation. Introducing the oxygen promoter or damage enables the oxidation to be more efficiently performed. The basic process following the strip of the photoresist 300a is similar to that of the above-described embodiment. Thus, a nonvolatile semiconductor memory device is obtained which is similar to that described above in the embodiment.

As described above, in the present modification, as in the case of the above-described embodiment, the intermediate insulating film 30 in the select transistor formation region is selectively oxidized. Thus, as is the case with the above-described embodiment, the memory cell transistor is provided with the charge storage insulating film with the high trap level density, allowing charges to be reliably stored in the memory cell transistor. Furthermore, the select transistor is provided with the excellent gate insulating film with the low trap level density. Therefore, the present modification provides a nonvolatile semiconductor memory device including memory cell transistors and select transistors and offering excellent characteristics and high reliability, without the need for a large number of process steps.

Second Embodiment

Figure 11A:
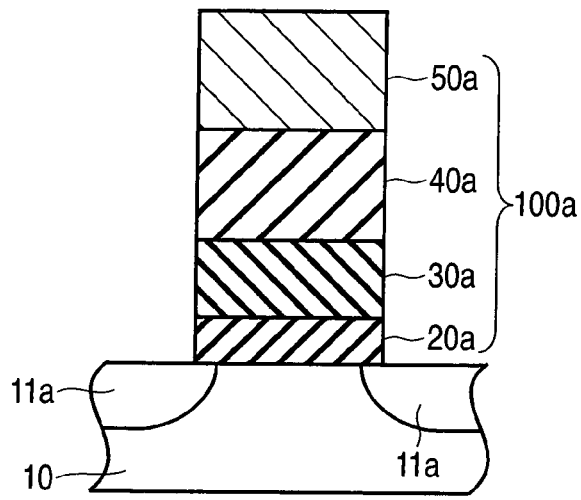
FIGS. 11A and 11B are sectional views schematically showing a configuration of a semiconductor device according to a second embodiment of the present invention.
Figure 11B:
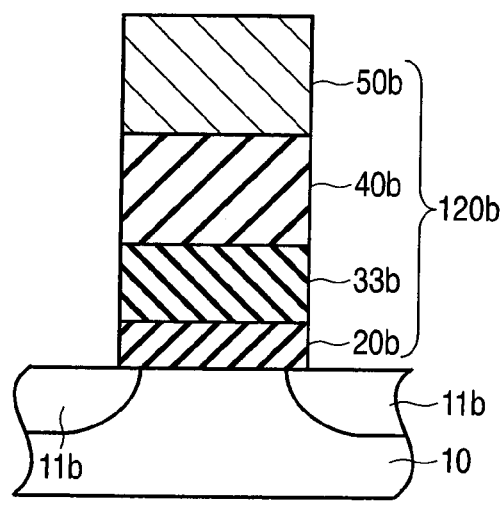

FIGS. 11A and 11B schematically show a configuration of a semiconductor device according to a second embodiment of the present invention.

A basic structure and a basic manufacturing method according to the second embodiment are similar to those of the first embodiment described above. Thus, the matters described above in the first embodiment and matters easily conceivable from the above-described embodiment will not be described.

In the present embodiment, as in the case of the first embodiment, the charge storage insulating film (intermediate insulating film) 30a in the memory cell transistor 100a is formed of an insulating film containing silicon nitride offering a high trap level density, as a main component. On the other hand, an insulating film (intermediate insulating film) 33b in a select transistor 120b is formed of an insulating film containing silicon nitride containing fluorine, as a main component. The insulating film 33b has a higher fluorine concentration than the charge storage insulating film 30a. Thus, dangling bonds in the insulating film 33b are terminated by the fluorine, thus reducing the trap level density. As a result, the trap level density of the insulating film 33b is substantially lower than that of the charge storage insulating film 30a. Therefore, charges can be prevented from being stored in the insulating film 33b.

Thus, according to the present embodiment, the intermediate insulating film 33b, provided in the select transistor 120b, has a higher fluorine concentration that the intermediate insulating film (charge storage insulating film) 30a, provided in the memory cell transistor 100b. Thus, the dangling bonds are terminated by the fluorine, reducing the trap level density. As a result, charges are prevented from being trapped in the insulating film 33b when a voltage is applied to the select transistor 120b. That is, a possible variation in the threshold value for the select transistor 120b caused by the charge trapping in the insulating film 33b can be inhibited. As a result, the select transistor 120b is prevented from malfunctioning, allowing stable select transistor characteristics to be obtained. On the other hand, the charge storage insulating film 30a with the high trap level density is formed in the memory cell transistor. Thus, charges can be reliably stored in the memory cell transistor. Therefore, present embodiment can provide a nonvolatile semiconductor memory device offering excellent characteristics and high reliability.

Now, a method of manufacturing a semiconductor device according to the present embodiment will be described with reference to FIGS. 12A, 12B, 13A, 13B, 14A, 14B, 15A, and 15B.

Figure 12A:
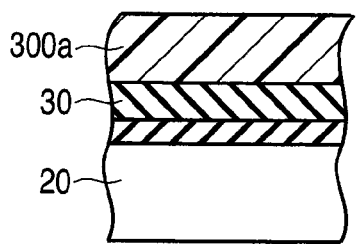
FIGS. 12A and 12B are sectional views schematically showing a part of a process of manufacturing a semiconductor device according to the second embodiment of the present invention.
Figure 12B:
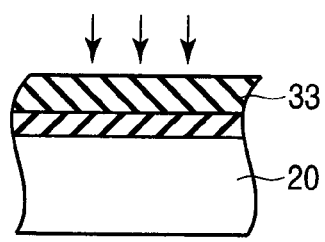

After the step shown in FIGS. 2A and 2B for the first embodiment, as shown in FIGS. 12A and 12B, a photoresist is coated all over the resulting surface, and the photoresist coated in the select transistor formation region is removed using the lithography process. Subsequently, an appropriate amount of fluorine is introduced by the ion implantation method or plasma doping method so as to terminate the dangling bonds in the intermediate insulating film formed of the silicon nitride film. Introduction of a large amount of fluorine allows a high oxidation promotion effect to be exerted. However, introduction of a small amount of fluorine fails to allow a high oxidation promotion effect to be exerted but is instead effective for terminating the dangling bonds in the silicon nitride film to reduce the trap level density. As shown in FIG. 12A, the memory cell transistor formation region is masked by the photoresist film 300a. Furthermore, as shown in FIG. 12B, the photoresist is removed from the select transistor formation region. Thus, fluorine is selectively introduced into the intermediate insulating film 30 in the select transistor formation region. As a result, the intermediate insulating film 30 formed in the select transistor formation region becomes an intermediate insulating film 33 with a low trap level density.

The subsequent basic process is similar to that of the first embodiment. That is, as shown in FIGS. 13A and 13B, the photoresist film 300a is stripped. Then, as is the case with the first embodiment, the upper insulating film 40 for the block insulating film and the gate electrode film 50 are formed on each of the insulating films 30 and 33. Subsequently, as shown in FIGS. 14A and 14B, the photoresist films 500a and 500b are formed on the gate electrode film 50. Moreover, as shown in FIGS. 15A and 15B, etching (patterning) is performed as is the case with the first embodiment.

As a result, as shown in FIG. 15A, the gate structure of the memory cell transistor 100a is formed which is made up of the tunnel insulating film 20a, charge storage insulating film 30a, block insulating film 40a, and control gate electrode 50a provided on the semiconductor substrate 10. Furthermore, as shown in FIG. 15B, the gate structure of the select transistor 120b is formed which is made up of the insulating film 20b, insulating film 33b, insulating film 40b, and gate electrode 50b provided on the semiconductor substrate 10.

The subsequent process is also similar to that of the first embodiment, and such a nonvolatile semiconductor storage device as shown in FIGS. 11A and 11B is obtained.

According to the above-described embodiment, after the photoresist 300a is formed on the intermediate insulating film 30, the appropriate amount of fluorine is introduced into the intermediate insulating film 30 in the select transistor formation region to form the insulating film 33 containing fluorine. As a result, the fluorine concentration of the intermediate insulating film 33 of the select transistor formation region is higher than that of the intermediate insulating film 30 of the memory cell transistor formation region. Since fluorine is introduced into the charge storage insulating film 30 in the select transistor formation region, the dangling bonds in the charge storage insulating film 30 in the select transistor formation region are terminated by the fluorine. Thus, the trap level in the intermediate insulating film 30 in the select transistor formation region decreases. Consequently, possible charge trapping in the insulating film 32 can be prevented when a voltage is applied to the select transistor 120b. That is, a possible variation in the threshold value for the select transistor 120b caused by the charge trapping in the insulating film 33b can be inhibited. As a result, the select transistor 120b is prevented from malfunctioning, allowing stable select transistor characteristics to be obtained. Furthermore, the charge storage insulating film 30a, provided in the memory cell transistor 100a, offers the sufficient trap level density, allowing charges to be reliably stored in the memory cell transistor 100a. Consequently, like the first embodiment, the present embodiment provides a nonvolatile semiconductor memory device including memory cell transistors and select transistors and offering excellent characteristics and high reliability, without the need for a large number of process steps.

Third Embodiment

FIGS. 16A and 16B schematically show a configuration of a semiconductor device according to a third embodiment of the present invention. A basic structure and a basic manufacturing method according to the second modification are similar to those of the first embodiment described above. Thus, the matters described above in the first embodiment and matters easily conceivable from the above-described embodiment will not be described.

In the present embodiment, as in the case of the first embodiment, an insulating film (intermediate insulating film) 60b in a select transistor 130b is formed of an insulating film containing silicon nitride offering a very low trap level density, as a main component. On the other hand, an intermediate insulating film (charge storage insulating film) 62a in a memory cell transistor 130a is formed of an insulating film containing silicon nitride offering a high trap level density, as a main component.

As described above, the intermediate insulating film 62a, provided in the memory cell transistor 130a, offers a higher trap level density than the intermediate insulating film 60b, provided in the select transistor 130b. The trap level density of the intermediate insulating layer 60b is very low. Thus, a possible variation in the threshold value for the select transistor 130b caused by the charge trapping in the insulating film 60b can be inhibited. As a result, the select transistor 130b is prevented from malfunctioning, allowing stable select transistor characteristics to be obtained. On the other hand, the charge storage insulating film 62a with the high trap level density is formed in the memory cell transistor. Thus, charges can be reliably stored in the memory cell transistor. Therefore, present embodiment can provide a nonvolatile semiconductor memory device offering excellent characteristics and high reliability.

Now, a method of manufacturing a semiconductor device according to the present embodiment will be described with reference to FIGS. 17A, 17B, 18A, 18B, 19A, 19B, 20A, 20B, 21A, and 21B.

First, as shown in FIGS. 17A and 17B, a silicon oxide film of thickness 2 to 6 nm is formed on the semiconductor substrate 10 as the lower insulating film 20 for the tunnel insulating film by the thermal oxidation method. Thereafter, the resulting surface is exposed to an NO atmosphere at 700 to 900 degrees to introduce nitrogen into the silicon oxide film. This further improves the stress resistance of the tunnel insulating film 20. Subsequently, a silicon nitride film with a thickness of about 5 to 10 nm and a very low trap level density is deposited on the lower insulating film 20 as an intermediate insulating film 60 by using the ALD method at low temperatures of 300 to 400 degrees and alternately supplying DCS and $N_2^*$ ($N_2$ radical). Instead of $N_2$, $N^*$ (N radical) or $NH^*$ (NH radical) may be used. In this manner, the silicon nitride film 60 with the very low trap density is formed on the lower insulating film 20. The thus formed silicon nitride film 60 has a higher nitrogen rate than common silicon nitride films.

Then, as shown in FIGS. 18A and 18B, a photoresist is coated all over the resulting surface. The photoresist coated in the memory cell transistor formation region is then removed using the lithography process. A defect is subsequently formed in the silicon nitride film 60 by exposure to plasma of He, Ar, Xe, or the like or implantation of ions of a rare gas such as Ar or Xe, or Si, N, or the like. Any method other than those described above may be used provided that the method is intended to introduce a defect inducing trapping, into the silicon nitride film 60.

As shown in FIG. 18B, the select transistor formation region is masked by the photoresist film 300a. Furthermore, as shown in FIG. 18A, the photoresist is removed from the memory cell transistor formation region. Thus, the defect is introduced only into the intermediate insulating film 60 in the memory cell transistor formation region. As a result, the insulating film 60, formed in the memory cell transistor formation region, becomes a charge storage insulating film 61 in which a large number of defects are formed.

Then, as shown in FIGS. 19A and 19B, the photoresist film 300b is stripped. The surfaces of the insulating films 60 and 61 are exposed to a non-oxidizing atmosphere at 700 to 1,000 degrees for a thermal treatment. The thermal treatment enhances the oxidation resistance of the insulating film 61 into which the defect has been introduced. Furthermore, a shallow trap level that may degrade charge retention characteristics is removed from the insulating film 61, which becomes an insulating film 62. For the thermal treatment, the non-oxidizing atmosphere is preferable for prevention of possible oxidation of the silicon nitride film. However, adding a small amount of oxygen to the atmosphere poses no problem. Thereafter, as is the case with the first embodiment, the upper insulating film 40 for the block insulating film and the gate insulating film 50 are formed on each of the insulating films 60 and 62. Subsequently, as shown in FIGS. 20A and 20B, the photoresist films 500a and 500b are formed on the gate electrode film 50. Moreover, as shown in FIGS. 21A and 21B, etching (patterning) is performed as is the case with the first embodiment.

As a result, as shown in FIG. 21A, the gate structure of the memory cell transistor 130a is formed which is made up of the tunnel insulating film 20a, charge storage insulating film 62a, block insulating film 40a, and control gate electrode 50a provided on the semiconductor substrate 10. Furthermore, as shown in FIG. 21B, the gate structure of the select transistor 130b is formed which is made up of the insulating film 20b, insulating film 60b, insulating film 40b, and gate electrode 50b provided on the semiconductor substrate 10.

The subsequent process is also similar to that of the first embodiment, and such a nonvolatile semiconductor storage device as shown in FIGS. 16A and 16B is obtained.

Thus, according to the present embodiment, after the intermediate insulating film 60 with the very low trap level density is formed on the lower insulating film 20, the process of forming a defect in the intermediate insulating film 60 in the memory cell transistor formation region is executed. As a result, in the intermediate insulating film 62a of the memory cell transistor, a defect is formed which leads to the significant increase in the trap level. Thus, the intermediate insulating film 62a in the memory cell transistor functions as a charge storage insulating film to allow a data write operation and a data erase operation to be accurately performed. Furthermore, the intermediate insulating film 60b in the select transistor is formed of the material with the very low trap level density. Thus, a possible variation in the threshold value for the select transistor 130b caused by the charge trapping in the insulating film 62a can be inhibited. As a result, the memory cell transistor 130a and the select transistor 130b are prevented from malfunctioning, allowing stable select transistor characteristics to be obtained. The present embodiment provides a nonvolatile semiconductor memory device including memory cell transistors and select transistors and offering excellent characteristics and high reliability, without the need for a large number of process steps.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a memory cell transistor including a first lower insulating film provided on a semiconductor substrate, a first intermediate insulating film provided on the first lower insulating film, a first upper insulating film provided on the first intermediate insulating film, and a first gate electrode provided on the first upper insulating film; and
   a select transistor including a second lower insulating film provided on the semiconductor substrate and formed of same insulating material film as that of the first lower insulating film, a second intermediate insulating film provided on the second lower insulating film, a second upper insulating film provided on the second intermediate insulating film and formed of same insulating material film as that of the first upper insulating film, and a second gate electrode provided on the second upper insulating film and formed of same conductive material film as that of the first gate electrode,
   wherein the first and second intermediate insulating films are formed of silicon oxynitride, and a trap density of the second intermediate insulating film is lower than that of the first intermediate insulating film.

2. The device according to claim 1, wherein the first intermediate insulating film is a charge storage insulating film.

3. A semiconductor device comprising:
   a memory cell transistor including a first lower insulating film provided on a semiconductor substrate, a first intermediate insulating film provided on the first lower insulating film, a first upper insulating film provided on the first intermediate insulating film, and a first gate electrode provided on the first upper insulating film; and
   a select transistor including a second lower insulating film provided on the semiconductor substrate and formed of same insulating material film as that of the first lower insulating film, a second intermediate insulating film provided on the second lower insulating film, a second upper insulating film provided on the second intermediate insulating film and formed of same insulating material film as that of the first upper insulating film, and a second gate electrode provided on the second upper insulating film and formed of same conductive material film as that of the first gate electrode,
   wherein the first and second intermediate insulating films are formed of silicon oxynitride, and an oxygen concentration of the second intermediate insulating film is higher than that of the first intermediate insulating film.

4. The device according to claim 3, wherein the first intermediate insulating film is a charge storage insulating film.

* * * * *